US010610973B2

(12) United States Patent
Hirata

(10) Patent No.: US 10,610,973 B2
(45) Date of Patent: Apr. 7, 2020

(54) WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 175 days.

(21) Appl. No.: 15/165,259

(22) Filed: May 26, 2016

(65) Prior Publication Data

US 2016/0354862 A1 Dec. 8, 2016

(30) Foreign Application Priority Data

Jun. 2, 2015 (JP) ................................. 2015-112316

(51) Int. Cl.
*B23K 26/53* (2014.01)
*B28D 5/00* (2006.01)
*H01L 21/02* (2006.01)
*B23K 103/00* (2006.01)

(52) U.S. Cl.
CPC ............ *B23K 26/53* (2015.10); *B28D 5/0011* (2013.01); *H01L 21/02005* (2013.01); *B23K 2103/56* (2018.08)

(58) Field of Classification Search
CPC ... C03B 33/091; C03B 33/093; C03B 33/102; B23K 23/53; B28D 5/0011
See application file for complete search history.

(56) References Cited

U.S. PATENT DOCUMENTS

| 5,223,692 A | 6/1993 | Lozier et al. |
| 5,561,544 A | 10/1996 | Macken |
| 5,581,572 A | 12/1996 | Delorme et al. |
| 5,912,186 A | 6/1999 | Yoshino et al. |
| 6,720,522 B2 | 4/2004 | Ikegami et al. |
| 7,160,790 B2 | 1/2007 | Henley et al. |
| 7,374,955 B2 | 5/2008 | Izumome |

(Continued)

FOREIGN PATENT DOCUMENTS

| JP | 2000-094221 | 4/2000 |
| JP | 2002373870 A | 12/2002 |

(Continued)

OTHER PUBLICATIONS

Cutting off axis wafers—Virginia Semi, 2002 (Year: 2002).*

(Continued)

*Primary Examiner* — Kenneth E Peterson
(74) *Attorney, Agent, or Firm* — Greer Burns & Crain, Ltd.

(57) ABSTRACT

A wafer producing method for producing a hexagonal single crystal wafer from a hexagonal single crystal ingot, including a separation start point forming step of setting the focal point of a laser beam inside the ingot at a predetermined depth from the ingot's upper surface, which depth corresponds to the thickness of the wafer to be produced, and next applying the laser beam while relatively moving the focal point and the ingot to thereby form: (i) a modified layer parallel to the ingot's upper surface, and (ii) cracks extending from the modified layer, thus forming a separation start point. The laser beam is applied to form the modified layer in a condition where the relation of $-0.3 \leq (d-x)/d \leq 0.5$ holds, where d is the diameter of a focused spot of the laser beam and x is the spacing between adjacent focused spots of the laser beam.

13 Claims, 12 Drawing Sheets

(56) References Cited

U.S. PATENT DOCUMENTS

| | | | |
|---|---|---|---|
| 7,566,635 B2 | 7/2009 | Fujii et al. | |
| 7,737,001 B2 | 6/2010 | Abe et al. | |
| 7,892,949 B2 | 2/2011 | Abe et al. | |
| 8,148,184 B2 | 4/2012 | Koyanagi et al. | |
| 8,263,479 B2 | 9/2012 | Fukuyo et al. | |
| 8,415,234 B2 | 4/2013 | Abatake | |
| 8,722,516 B2 * | 5/2014 | Yamada | H01L 33/0095 257/E21.237 |
| 8,790,997 B2 | 7/2014 | Nakagawa et al. | |
| 9,138,913 B2 | 9/2015 | Arai et al. | |
| 9,174,305 B2 | 11/2015 | Morikazu et al. | |
| 9,193,008 B2 | 11/2015 | Morikazu et al. | |
| 9,478,696 B2 | 10/2016 | Tajikara et al. | |
| 9,481,051 B2 | 11/2016 | Hirata et al. | |
| 9,488,831 B2 | 11/2016 | Ito et al. | |
| 9,517,530 B2 | 12/2016 | Hirata et al. | |
| 9,620,415 B2 | 4/2017 | Hirata et al. | |
| 9,757,815 B2 | 9/2017 | Hosseini | |
| 9,789,565 B2 | 10/2017 | Hirata et al. | |
| 9,850,160 B2 | 12/2017 | Marjanovic et al. | |
| 9,878,397 B2 | 1/2018 | Hirata et al. | |
| 2003/0141505 A1 | 7/2003 | Isobe et al. | |
| 2004/0002199 A1 * | 1/2004 | Fukuyo | B23K 26/0057 438/460 |
| 2004/0144301 A1 | 7/2004 | Neudeck et al. | |
| 2004/0232124 A1 * | 11/2004 | Nagai | B23K 26/0063 219/121.72 |
| 2005/0199592 A1 | 9/2005 | Iri et al. | |
| 2005/0217560 A1 | 10/2005 | Tolchinsky et al. | |
| 2006/0008941 A1 | 1/2006 | Haskell et al. | |
| 2006/0079155 A1 | 4/2006 | Nakamura et al. | |
| 2006/0148210 A1 | 7/2006 | Furuta et al. | |
| 2006/0258047 A1 | 11/2006 | Nishiwaki et al. | |
| 2007/0111480 A1 | 5/2007 | Maruyama et al. | |
| 2007/0284764 A1 | 12/2007 | Sekiya | |
| 2008/0008641 A1 | 1/2008 | Leonard et al. | |
| 2008/0062430 A1 | 3/2008 | Horvath et al. | |
| 2008/0070380 A1 | 3/2008 | Kusunoki | |
| 2009/0056513 A1 | 3/2009 | Baer | |
| 2009/0117712 A1 | 5/2009 | Sakamoto et al. | |
| 2009/0127233 A1 | 5/2009 | Asano et al. | |
| 2009/0320897 A1 | 12/2009 | Shimomura | |
| 2010/0203706 A1 | 8/2010 | Ohnuma et al. | |
| 2011/0193269 A1 | 8/2011 | Ito et al. | |
| 2011/0195536 A1 | 8/2011 | Koyanagi et al. | |
| 2011/0195537 A1 | 8/2011 | Koyanagi et al. | |
| 2011/0298084 A1 * | 12/2011 | Tamemoto | B23K 26/0057 257/507 |
| 2012/0055546 A1 | 3/2012 | Turner | |
| 2012/0111495 A1 | 5/2012 | Shimoi et al. | |
| 2012/0234809 A1 | 9/2012 | Morikazu et al. | |
| 2012/0289028 A1 | 11/2012 | Abatake | |
| 2012/0298636 A1 | 11/2012 | Nomaru et al. | |
| 2013/0037825 A1 | 2/2013 | Hiraiwa et al. | |
| 2013/0171402 A1 | 7/2013 | Straubinger et al. | |
| 2013/0248500 A1 | 9/2013 | Shreter et al. | |
| 2014/0001679 A1 | 1/2014 | Okuma et al. | |
| 2014/0038392 A1 | 2/2014 | Yonehara et al. | |
| 2015/0038062 A1 | 2/2015 | Umeda et al. | |
| 2015/0121960 A1 | 5/2015 | Hosseini | |
| 2015/0151380 A1 * | 6/2015 | Hosseini | B23K 26/009 428/600 |
| 2015/0217400 A1 | 8/2015 | Yamada | |
| 2015/0360991 A1 * | 12/2015 | Grundmueller | B23K 26/0648 428/141 |
| 2015/0376813 A1 | 12/2015 | Tsuchida et al. | |
| 2016/0052090 A1 | 2/2016 | Tanigawa | |
| 2016/0093763 A1 | 3/2016 | Rana et al. | |
| 2016/0121426 A1 | 5/2016 | Hollinger et al. | |
| 2016/0158881 A1 | 6/2016 | Hirata et al. | |
| 2016/0163549 A1 * | 6/2016 | Okuma | B23K 26/0057 438/463 |
| 2016/0228984 A1 | 8/2016 | Hirata et al. | |
| 2016/0293397 A1 | 10/2016 | Hirata et al. | |
| 2016/0354863 A1 | 12/2016 | Hirata | |
| 2017/0015017 A1 | 1/2017 | Hirata | |
| 2017/0053829 A1 | 2/2017 | Hirata et al. | |
| 2017/0250113 A1 | 8/2017 | Vanagas et al. | |
| 2017/0355041 A1 | 12/2017 | Yamashita et al. | |

FOREIGN PATENT DOCUMENTS

| | | | |
|---|---|---|---|
| JP | 2007019379 A | 1/2007 | |
| JP | 2013-049161 | * 3/2013 | B29D 5/00 |

OTHER PUBLICATIONS

U.S. Appl. No. 14/955,352, filed Dec. 1, 2015.
U.S. Appl. No. 14/955,306, filed Dec. 1, 2015.
U.S. Appl. No. 14/953,718, filed Nov. 30, 2015.
U.S. Appl. No. 14/953,679, filed Nov. 30, 2015.
U.S. Appl. No. 14/988,310, filed Jan. 5, 2016.
U.S. Appl. No. 14/988,378, filed Jan. 5, 2016.
U.S. Appl. No. 15/015,852, filed Feb. 4, 2016.
U.S. Appl. No. 15/014,367, filed Feb. 3, 2016.
U.S. Appl. No. 15/015,532, filed Feb. 4, 2016.
U.S. Appl. No. 15/088,386, filed Apr. 1, 2016.
U.S. Appl. No. 15/083,635, filed Mar. 29, 2016.
U.S. Appl. No. 15/088,441, filed Apr. 1, 2016.
U.S. Appl. No. 15/165,686, filed May 26, 2016.
U.S. Appl. No. 15/205,644, filed Jul. 8, 2016.
Yoshida et al., Dependences of Laser-Induced Bulk Damage Threshold and Crack Patterns in several Nonlinear Crystals on Irradiation Direction, Feb. 8, 2006, Japanese Journal of Applied Physics, vol. 45, No. 2A, pp. 766-769.
Hirata et al., U.S. Appl. No. 15/209,292, filed Jul. 13, 2016.
Kazuya Hirata, U.S. Appl. No. 15/212,513, filed Jul. 18, 2016.

* cited by examiner

WAFER PRODUCING METHOD

BACKGROUND OF THE INVENTION

Field of the Invention

The present invention relates to a wafer producing method for slicing a hexagonal single crystal ingot to produce a wafer.

Description of the Related Art

Various devices such as ICs and LSIs are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips corresponding to the respective devices. The device chips thus obtained are widely used in various equipment such as mobile phones and personal computers. Further, power devices or optical devices such as LEDs and LDs are formed by forming a functional layer on the front side of a wafer formed of a hexagonal single crystal such as SiC and GaN and partitioning this functional layer into a plurality of regions along a plurality of crossing division lines.

In general, the wafer on which the devices are to be formed is produced by slicing an ingot with a wire saw. Both sides of the wafer obtained above are polished to a mirror finish (see Japanese Patent Laid-open No. 2000-94221, for example). This wire saw is configured in such a manner that a single wire such as a piano wire having a diameter of about 100 to 300 µm is wound around many grooves formed on usually two to four guide rollers to form a plurality of cutting portions spaced in parallel with a given pitch. The wire is operated to run in one direction or opposite directions, thereby slicing the ingot into a plurality of wafers.

However, when the ingot is cut by the wire saw and both sides of each wafer are polished to obtain the product, 70 to 80% of the ingot is discarded to cause a problem of poor economy. In particular, a hexagonal single crystal ingot of SiC or GaN, for example, has high Mohs hardness and it is therefore difficult to cut this ingot with the wire saw. Accordingly, considerable time is required for cutting of the ingot, causing a reduction in productivity. That is, there is a problem in efficiently producing a wafer in this prior art.

A technique for solving this problem is described in Japanese Patent Laid-open No. 2013-49161. This technique includes the steps of setting the focal point of a laser beam having a transmission wavelength to SiC inside a hexagonal single crystal ingot, next applying the laser beam to the ingot as scanning the laser beam on the ingot to thereby form a modified layer and cracks in a separation plane inside the ingot, and next applying an external force to the ingot to thereby break the ingot along the separation plane where the modified layer and the cracks are formed, thus separating a wafer from the ingot. In this technique, the laser beam is scanned spirally or linearly along the separation plane so that a first application point of the laser beam and a second application point of the laser beam nearest to the first application point have a predetermined positional relation with each other. As a result, the modified layer and the cracks are formed at very high density in the separation plane of the ingot.

SUMMARY OF THE INVENTION

However, in the ingot cutting method described in Japanese Patent Laid-open No. 2013-49161 mentioned above, the laser beam is scanned spirally or linearly on the ingot. In the case of linearly scanning the laser beam, the direction of scanning of the laser beam is not specified. In the ingot cutting method described in Japanese Patent Laid-open No. 2013-49161 the pitch (spacing) between the first application point and the second application point of the laser beam as mentioned above is set to 1 to 10 µm. This pitch corresponds to the pitch of the cracks extending from the modified layer along a c-plane defined in the ingot.

In this manner, the pitch of the application points of the laser beam to be applied to the ingot is very small. Accordingly, regardless of whether the laser beam is scanned spirally or linearly, the laser beam must be applied with a very small pitch and the improvement in productivity is not yet sufficient.

It is therefore an object of the present invention to provide a wafer producing method which can efficiently produce a wafer from an ingot.

In accordance with an aspect of the present invention, there is provided a wafer producing method for producing a hexagonal single crystal wafer from a hexagonal single crystal ingot having a first surface, a second surface opposite to the first surface, a c-axis extending from the first surface to the second surface, and a c-plane perpendicular to the c-axis, the wafer producing method including a separation start point forming step of setting a focal point of a laser beam having a transmission wavelength to the ingot inside the ingot at a predetermined depth from the first surface, which depth corresponds to a thickness of the wafer to be produced, and next applying the laser beam to the first surface as relatively moving the focal point and the ingot to thereby form a modified layer parallel to the first surface and cracks extending from the modified layer along the c-plane, thus forming a separation start point, and a wafer separating step of separating a plate-shaped member having a thickness corresponding to the thickness of the wafer from the ingot at the separation start point after performing the separation start point forming step, thus producing the wafer from the ingot. The separation start point forming step includes a modified layer forming step of relatively moving the focal point of the laser beam in a first direction perpendicular to a second direction where the c-axis is inclined by an off angle with respect to a normal to the first surface and the off angle is formed between the first surface and the c-plane, thereby linearly forming the modified layer extending in the first direction, and an indexing step of relatively moving the focal point in the second direction to thereby index the focal point by a predetermined amount. In the modified layer forming step, the laser beam is applied in a condition where a relation of $-0.3 \leq (d-x)/d \leq 0.5$ holds, where d is a diameter of a focused spot of the laser beam and x is a spacing between adjacent focused spots of the laser beam.

According to the wafer producing method of the present invention, the focal point of the laser beam is relatively moved in the first direction perpendicular to the second direction where the off angle is formed between the first surface and the c-plane of the ingot, thereby linearly forming the modified layer extending in the first direction. Thereafter, the focal point of the laser beam is indexed in the second direction by the predetermined amount. Thereafter, the focal point of the laser beam is relatively moved again in the first direction to thereby linearly form the modified layer extending in the first direction. Such a series of steps are repeated to form a plurality of modified layers extending in the first direction, wherein each modified layer is formed at the predetermined depth from the first surface of the ingot and the cracks are formed on both sides of each modified layer so as to propagate along the c-plane. Accordingly, any adjacent ones of the plural modified layers are connected together through the cracks formed therebetween, so that the plate-shaped member having the thickness corresponding to the thickness of the wafer can be easily separated from the ingot at the separation start point, thus producing the hexagonal single crystal wafer from the ingot.

The scanning direction of the laser beam is set to the first direction perpendicular to the second direction where the off angle is formed. Furthermore, the diameter of the focused spot of the laser beam and the spacing between the adjacent focused spots of the laser beam are set in an optimum range. Accordingly, the cracks formed on both sides of each modified layer so as to propagate along the c-plane extend very long, so that the index amount of the focal point can be increased to thereby sufficiently improve the productivity. Further, the amount of the ingot to be discarded can be sufficiently reduced to about 30%.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
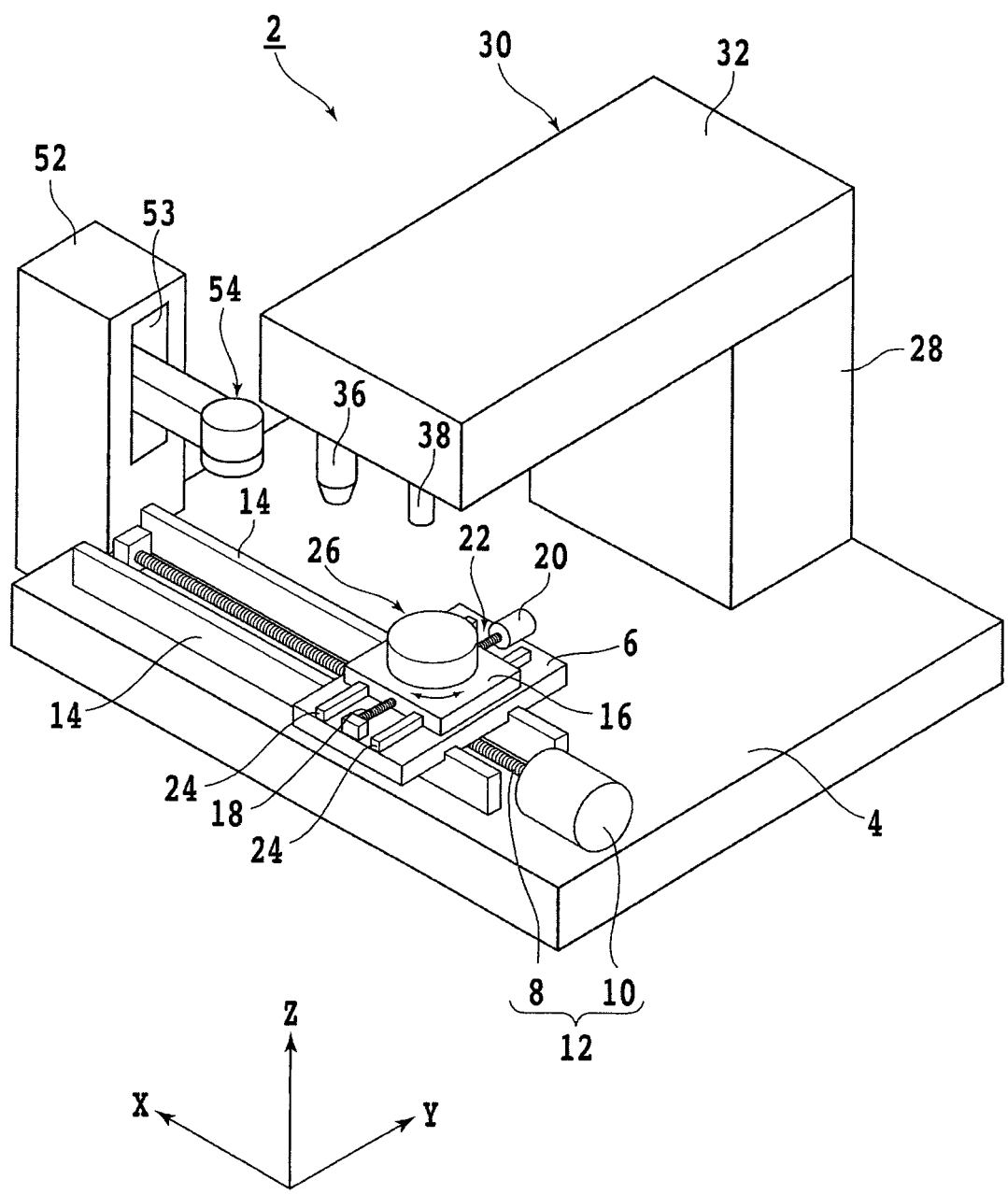
FIG. 1 is a perspective view of a laser processing apparatus suitable for use in performing a wafer producing method of the present invention.

A preferred embodiment of the present invention will now be described in detail with reference to the drawings. Referring to FIG. 1, there is shown a perspective view of a laser processing apparatus 2 suitable for use in performing a wafer producing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction.

Figure 2:
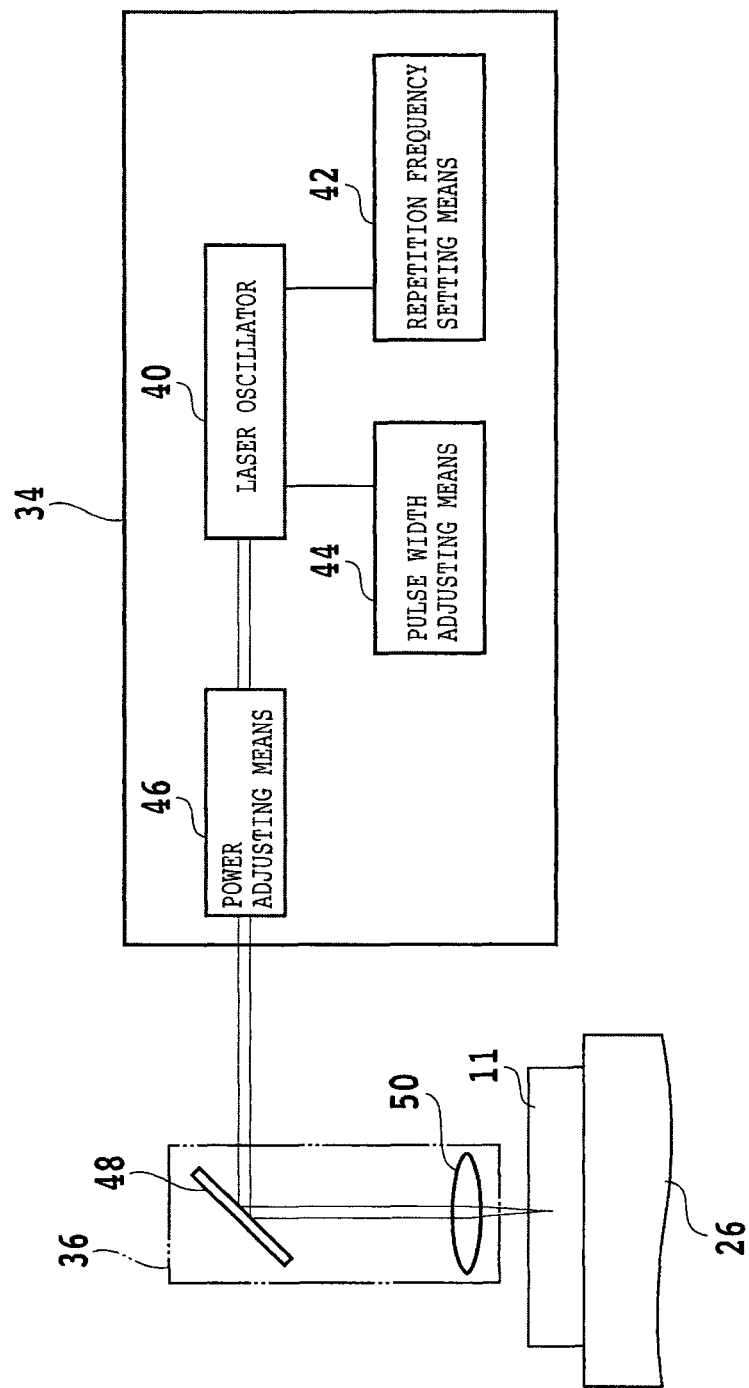
FIG. 2 is a block diagram of a laser beam generating unit.

As shown in FIG. 2, the laser beam generating unit 34 includes a laser oscillator 40 for generating a pulsed laser beam such as YAG laser and YVO4 laser, repetition frequency setting means 42 for setting the repetition frequency of the pulsed laser beam to be generated from the laser oscillator 40, pulse width adjusting means 44 for adjusting the pulse width of the pulsed laser beam to be generated from the laser oscillator 40, and power adjusting means 46 for adjusting the power of the pulsed laser generated from the laser oscillator 40. Although especially not shown, the laser oscillator 40 has a Brewster window, so that the laser beam generated from the laser oscillator 40 is a laser beam of linearly polarized light. After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside a hexagonal single crystal ingot 11 as a workpiece fixed to the support table 26.

Figure 3A:
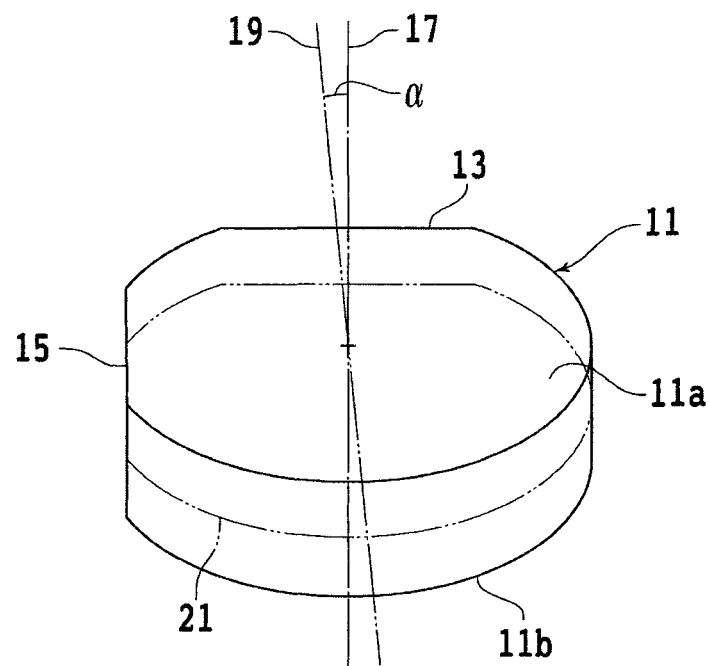
FIG. 3A is a perspective view of a hexagonal single crystal ingot.
Figure 3B:
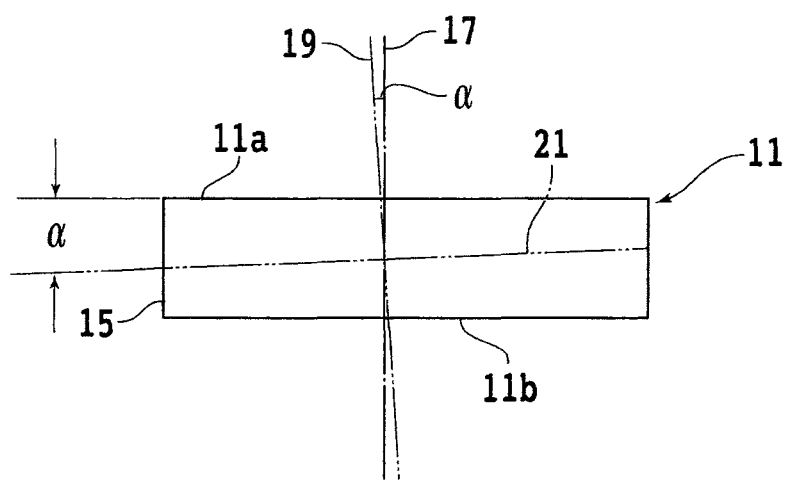
FIG. 3B is an elevational view of the ingot shown in FIG. 3A.

Referring to FIG. 3A, there is shown a perspective view of the hexagonal single crystal ingot 11 as a workpiece to be processed. FIG. 3B is an elevational view of the hexagonal single crystal ingot 11 shown in FIG. 3A. The hexagonal single crystal ingot (which will be hereinafter referred to also simply as ingot) 11 is selected from a SiC single crystal ingot or a GaN single crystal ingot. The ingot 11 has a first surface (upper surface) 11a and a second surface (lower surface) 11b opposite to the first surface 11a. The first surface 11a of the ingot 11 is preliminarily polished to a mirror finish because the laser beam is applied to the first surface 11a.

The ingot 11 has a first orientation flat 13 and a second orientation flat 15 perpendicular to the first orientation flat 13. The length of the first orientation flat 13 is set greater than the length of the second orientation flat 15. The ingot 11 has a c-axis 19 inclined by an off angle α toward the second orientation flat 15 with respect to a normal 17 to the upper surface 11a and also has a c-plane 21 perpendicular to the c-axis 19. The c-plane 21 is inclined by the off angle α with respect to the upper surface 11a. In general, in the hexagonal single crystal ingot 11, the direction perpendicular to the direction of extension of the shorter second orientation flat 15 is the direction of inclination of the c-axis 19. The c-plane 21 is set in the ingot 11 innumerably at the molecular level of the ingot 11. In this preferred embodiment, the off angle α is set to 4°. However, the off angle α is not limited to 4° in the present invention. For example, the off angle α may be freely set in the range of 1° to 6° in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
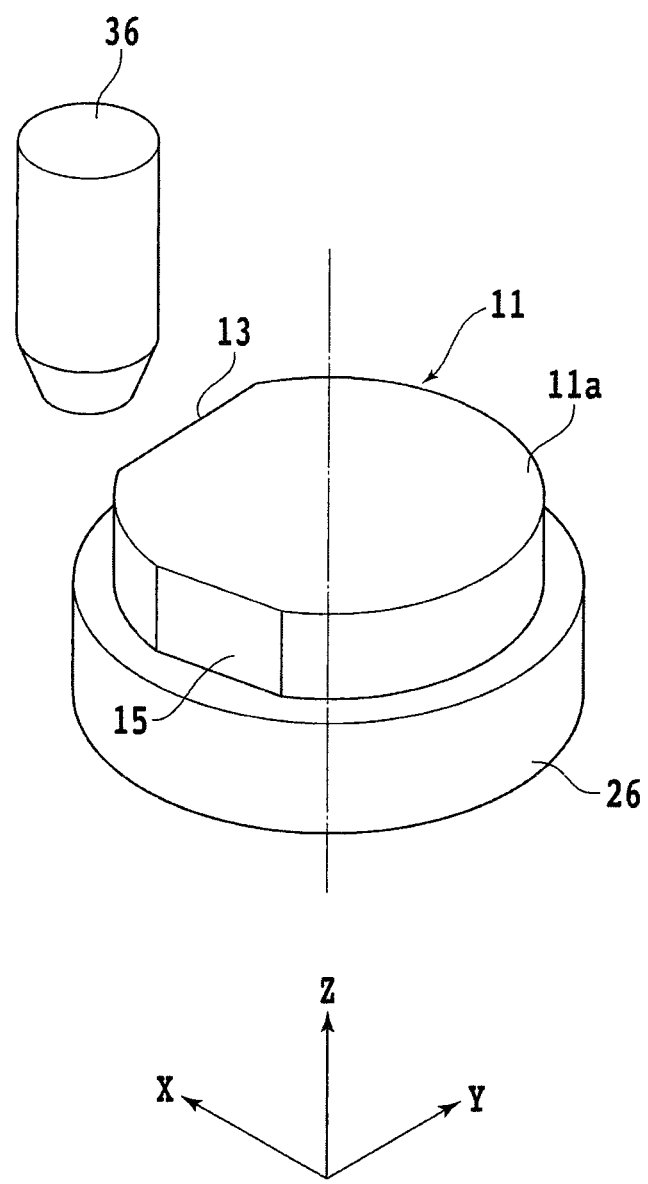
FIG. 4 is a perspective view for illustrating a separation start point forming step.
Figure 5:
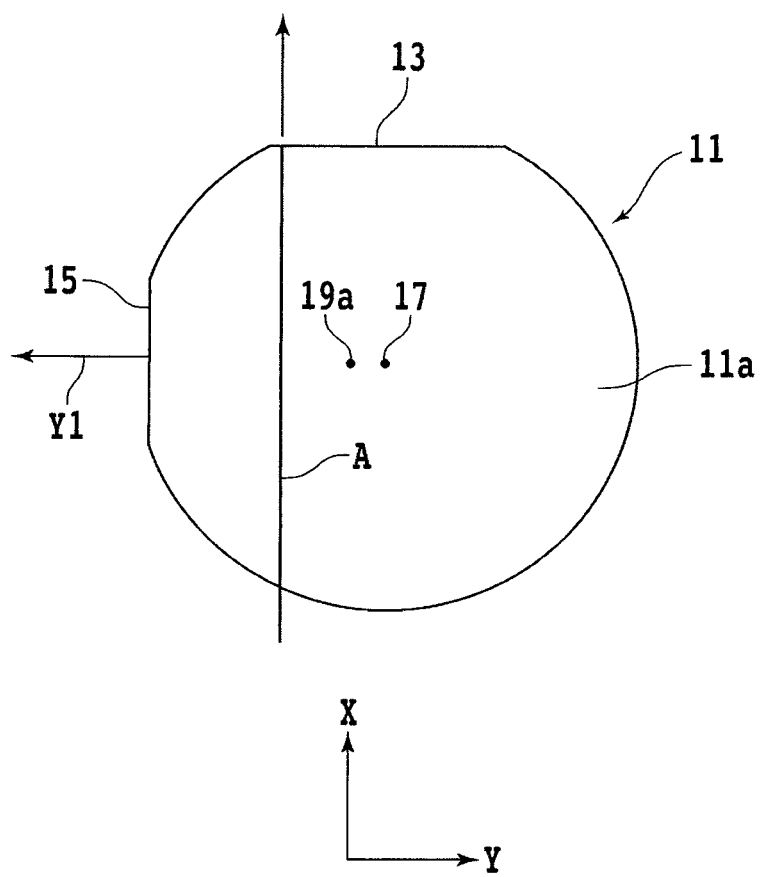
FIG. 5 is a plan view of the ingot shown in FIG. 3A.

As shown in FIG. 4, the ingot 11 is fixed to the upper surface of the support table 26 by using a wax or adhesive in the condition where the second orientation flat 15 of the ingot 11 becomes parallel to the X direction. In other words, as shown in FIG. 5, the direction of formation of the off angle α is shown by an arrow Y1. That is, the direction of the arrow Y1 is the direction where the intersection 19a between the c-axis 19 and the upper surface 11a of the ingot 11 is present with respect to the normal 17 to the upper surface 11a. Further, the direction perpendicular to the direction of the arrow Y1 is shown by an arrow A. Then, the ingot 11 is fixed to the support table 26 in the condition where the direction of the arrow A becomes parallel to the X direction.

Accordingly, the laser beam is scanned in the direction of the arrow A perpendicular to the direction of the arrow Y1, or the direction of formation of the off angle α. In other words, the direction of the arrow A perpendicular to the direction of the arrow Y1 where the off angle α is formed is defined as the feeding direction of the support table 26.

In the wafer producing method of the present invention, it is important that the scanning direction of the laser beam to be applied from the focusing means 36 is set to the direction of the arrow A perpendicular to the direction of the arrow Y1 where the off angle α of the ingot 11 is formed. That is, it was found that by setting the scanning direction of the laser beam to the direction of the arrow A as mentioned above in the wafer producing method of the present invention, cracks propagating from a modified layer formed inside the ingot 11 by the laser beam extend very long along the c-plane 21.

In performing the wafer producing method according to this preferred embodiment, a separation start point forming step is performed in such a manner that the focal point of the laser beam having a transmission wavelength (e.g., 1064 nm) to the hexagonal single crystal ingot 11 fixed to the support table 26 is set inside the ingot 11 at a predetermined depth from the first surface (upper surface) 11a, which depth corresponds to the thickness of a wafer to be produced, and the laser beam is next applied to the upper surface 11a as relatively moving the focal point and the ingot 11 to thereby form a modified layer 23 parallel to the upper surface 11a and cracks 25 propagating from the modified layer 23 along the c-plane 21, thus forming a separation start point (separation plane) where the modified layer 23 and the cracks 25 are formed.

Figure 7:
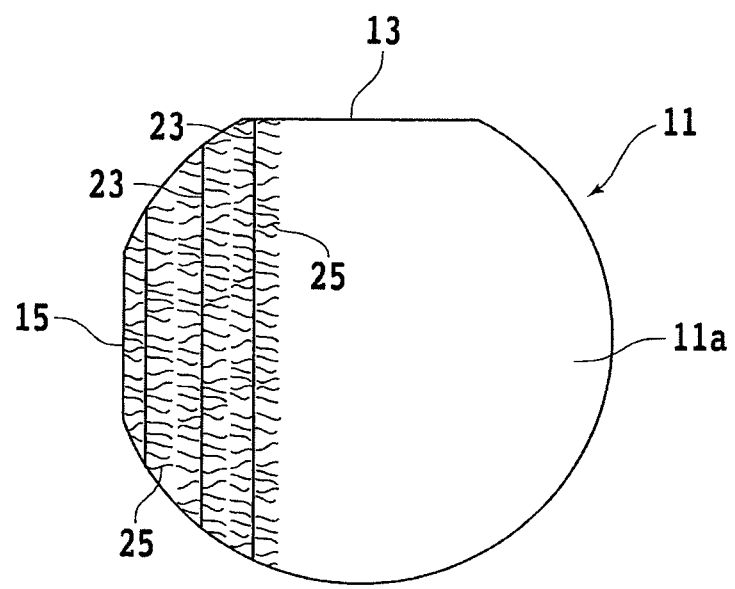
FIG. 7 is a schematic plan view for illustrating the modified layer forming step.

This separation start point forming step includes a modified layer forming step of relatively moving the focal point of the laser beam in the direction of the arrow A perpendicular to the direction of the arrow Y1 where the c-axis 19 is inclined by the off angle α with respect to the normal 17 to the upper surface 11a and the off angle α is formed between the c-plane 21 and the upper surface 11a, thereby forming the modified layer 23 inside the ingot 11 and the cracks 25 propagating from the modified layer 23 along the c-plane 21, and also includes an indexing step of relatively moving the focal point in the direction of formation of the off angle α, i.e., in the Y direction to thereby index the focal point by a predetermined amount as shown in FIG. 7 and FIGS. 8A and 8B.

Figure 6:
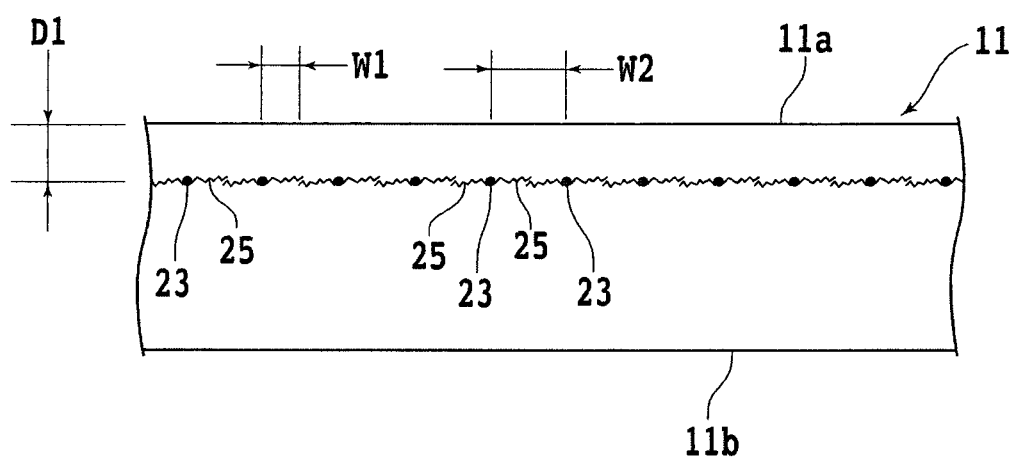
FIG. 6 is a schematic sectional view for illustrating a modified layer forming step.
Figure 6:
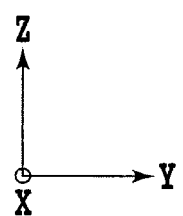

As shown in FIGS. 6 and 7, the modified layer 23 is linearly formed so as to extend in the X direction, so that the cracks 25 propagate from the modified layer 23 in opposite directions along the c-plane 21. In the wafer producing method according to this preferred embodiment, the separation start point forming step further includes an index amount setting step of measuring the width of the cracks 25 formed on one side of the modified layer 23 along the c-plane 21 and then setting the index amount of the focal point according to the width measured above. More specifically, letting W1 denote the width of the cracks 25 formed on one side of the modified layer 23 so as to propagate from the modified layer 23 along the c-plane 21, the index amount W2 of the focal point is set in the range of W1 to 2W1.

For example, the separation start point forming step is performed under the following laser processing conditions.

Light source: Nd:YAG pulsed laser
Wavelength: 1064 nm
Repetition frequency: 80 kHz
Average power: 3.2 W
Pulse width: 4 ns
Spot diameter: 3 μm
Numerical aperture (NA) of the focusing lens: 0.43
Index amount: 250 to 400 μm
Work feed speed: 120 to 260 nm/second In the laser processing conditions mentioned above, the width W1 of the cracks 25 propagating from the modified layer 23 along the C-plane 21 in one direction as viewed in FIG. 6 is set to about 250 μm, and the index amount W2 is set to 400 μm. However, the average power of the laser beam is not limited to 3.2 W. When the average power of the laser beam was set to 2 to 4.5 W, good results were obtained in the preferred embodiment. In the case that the average power was set to 2 W, the width W1 of the cracks 25 was about 100 μm. In the case that the average power was set to 4.5 W, the width W1 of the cracks 25 was about 350 μm.

In the case that the average power is less than 2 W or greater than 4.5 W, the modified layer 23 cannot be well formed inside the ingot 11. Accordingly, the average power of the laser beam to be applied is preferably set in the range of 2 to 4.5 W. For example, the average power of the laser beam to be applied to the ingot 11 was set to 3.2 W in this preferred embodiment. As shown in FIG. 6, the depth D1 of the focal point from the upper surface 11a in forming the modified layer 23 was set to 500 μm.

Figure 8:
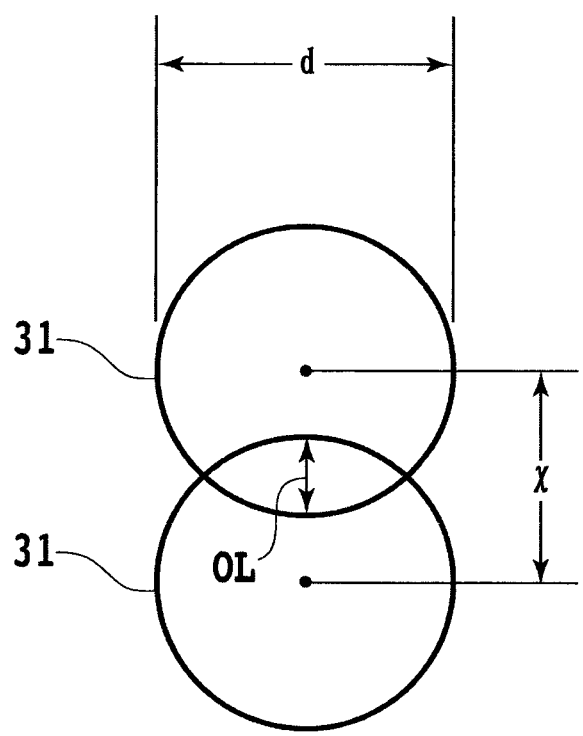
FIG. 8 is a schematic view showing the rate of overlap of adjacent focused spots.

There will now be described the optimum range of the rate of overlap of adjacent focused spots of the laser beam with reference to FIGS. 8 to 10. Referring to FIG. 8, there is shown a schematic view showing the rate of overlap of the adjacent focused spots. Letting d denote the diameter of a focused spot 31 and x denote the spacing between adjacent focused spots 31, the rate of overlap, OL, of the adjacent focused spots 31 is expressed as (d−x)/d×100%. In the case that the adjacent focused spots 31 are not overlapped, the overlap rate OL becomes a negative value.

Figure 9:
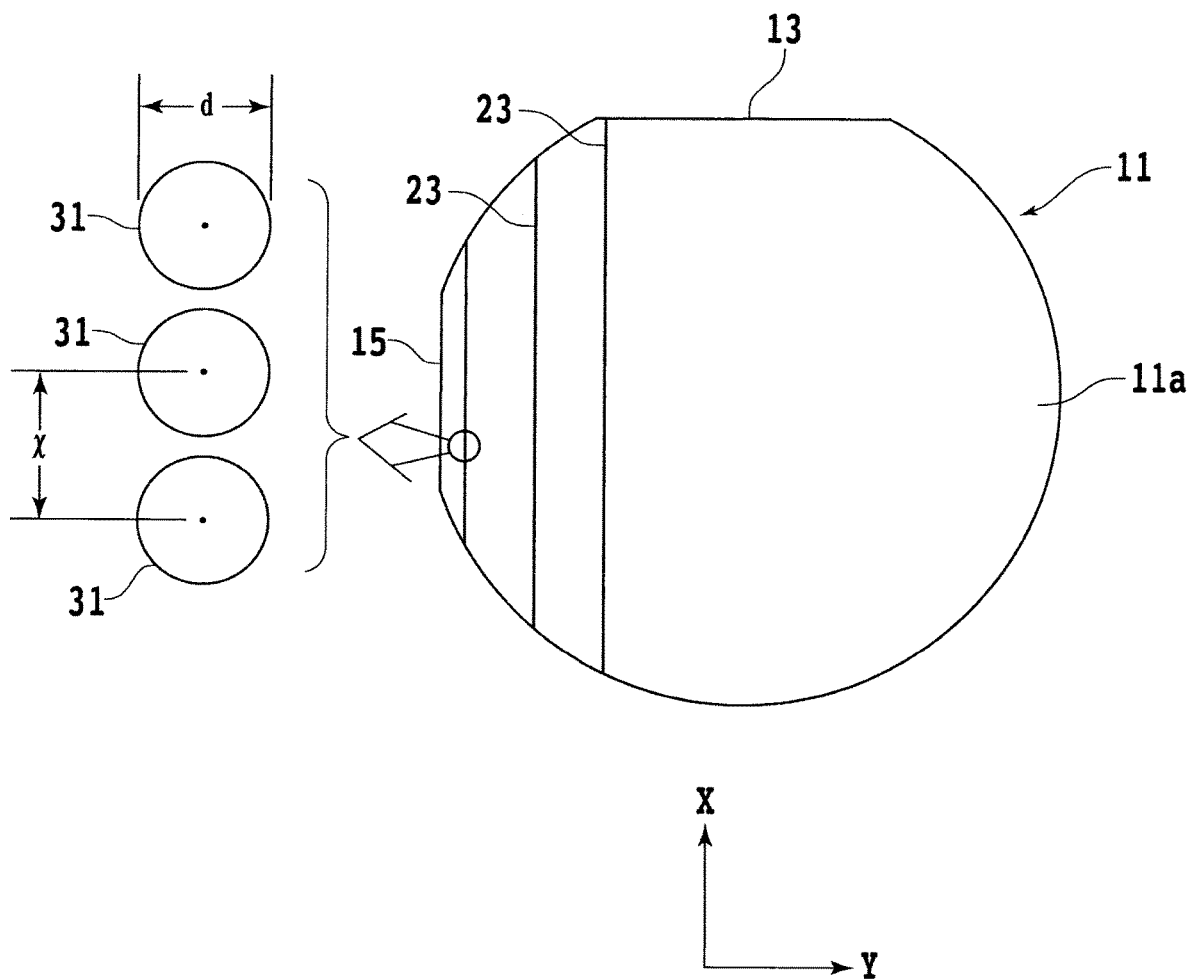
FIG. 9 is a schematic plan view showing the relation between modified layers formed in the ingot and the rate of overlap of adjacent focused spots.

Referring to FIG. 9, one modified layer 23 is formed inside the ingot 11 by scanning the laser beam in the X direction perpendicular to the direction of formation of the off angle. Thereafter, the focused spot (focal point) of the laser beam is indexed in the direction of formation of the off angle (i.e., in the Y direction), and the laser beam is next scanned in the X direction to form the next modified layer 23. Accordingly, the longer the length of each crack 25, the larger the index amount can be made.

Figure 10:
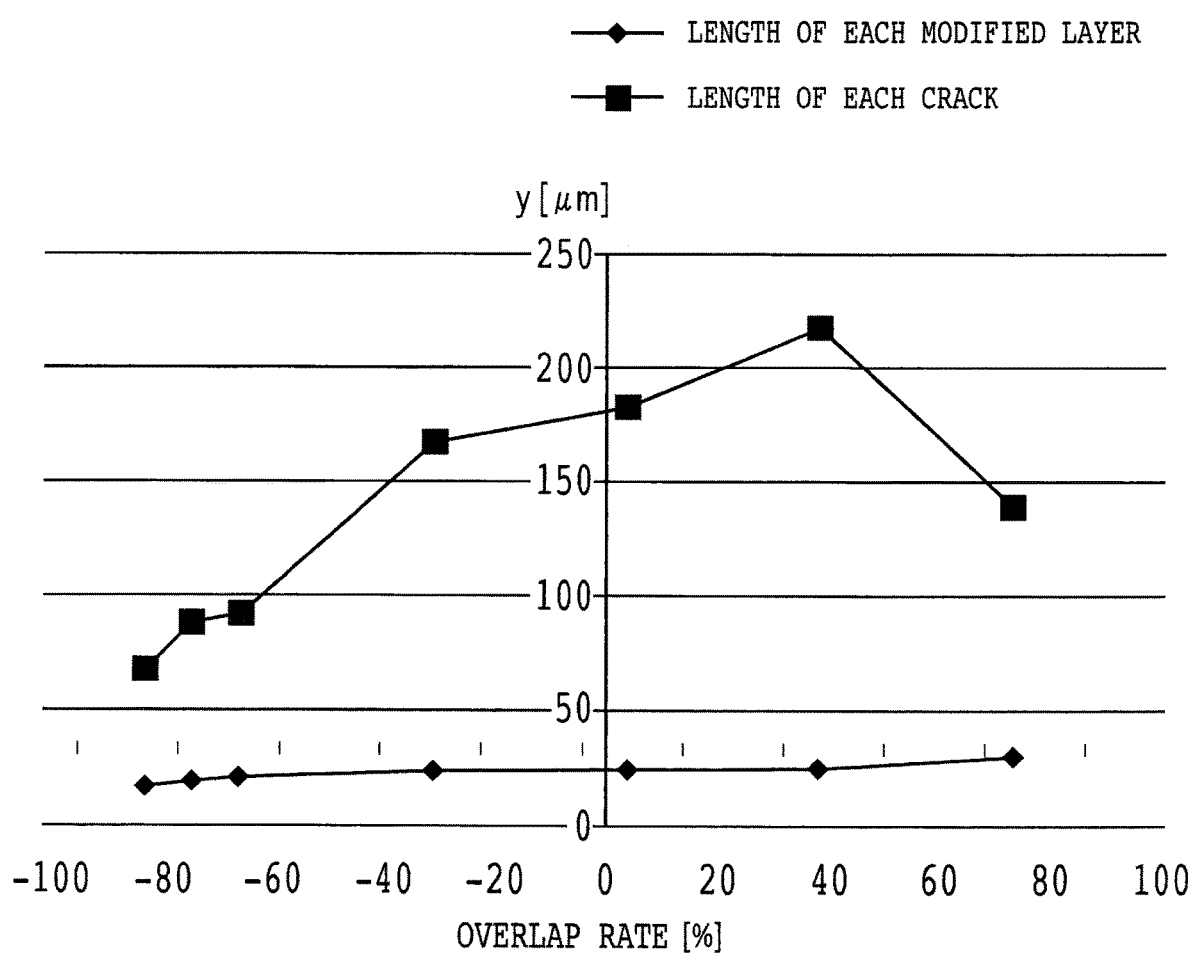
FIG. 10 is a graph showing the relation between the length of each crack formed in the ingot and the overlap rate.

FIG. 10 is a graph showing the relation between the length of each modified layer and the length of each crack in the case that the overlap rate is changed. As apparent from FIG. 10, the length of each modified layer 23 is almost constant regardless of a large change in the overlap rate. However, the length of each crack 25 varies largely according to a change in the overlap rate. In the case that the diameter of the optimum focused spot 31 is denoted by d, the relation of $d=1.22(\lambda/NA)$ holds, where $\lambda$ is the wavelength of the laser beam and NA is the numerical aperture of the focusing lens 50.

In the case that the wavelength $\lambda$ is 1064 nm and the numerical aperture NA of the focusing lens 50 is 0.43, the diameter d of the optimum focused spot 31 becomes 3.0 μm. The graph shown in FIG. 10 shows the overlap rate when the focused spot diameter is 3.0 μm. As apparent from the graph shown in FIG. 10, the optimum range of the overlap rate should be set to −30% to 50%, in order to make the length of each crack 25 as long as possible. Accordingly, the relation of $-0.3 \leq (d-x)/d \leq 0.5$ holds in the present invention.

Figure 12:
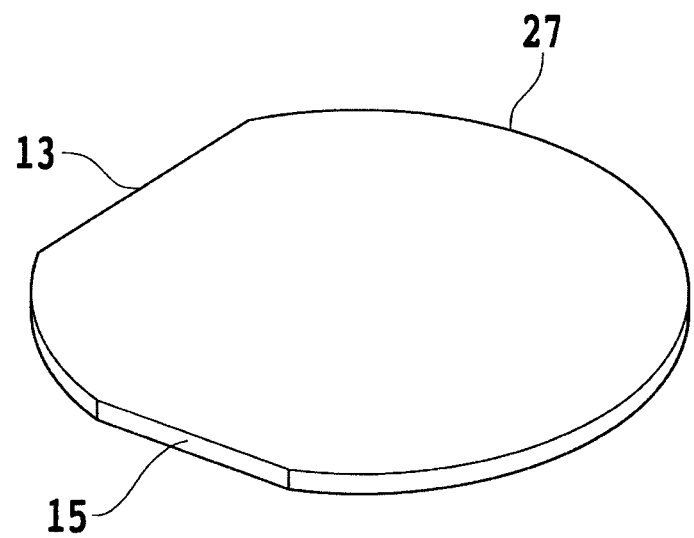
FIG. 12 is a perspective view of a hexagonal single crystal wafer produced from the ingot.

In this manner, the focal point of the laser beam is sequentially indexed to form a plurality of modified layers 23 at the depth D1 in the whole area of the ingot 11 and the cracks 25 extending from each modified layer 23 along the c-plane 21. Thereafter, a wafer separating step is performed in such a manner that an external force is applied to the ingot 11 to thereby separate a plate-shaped member having a thickness corresponding to the thickness of the wafer to be produced, from the ingot 11 at the separation start point composed of the modified layers 23 and the cracks 25, thus producing a hexagonal single crystal wafer 27 shown in FIG. 12.

Figure 11A:
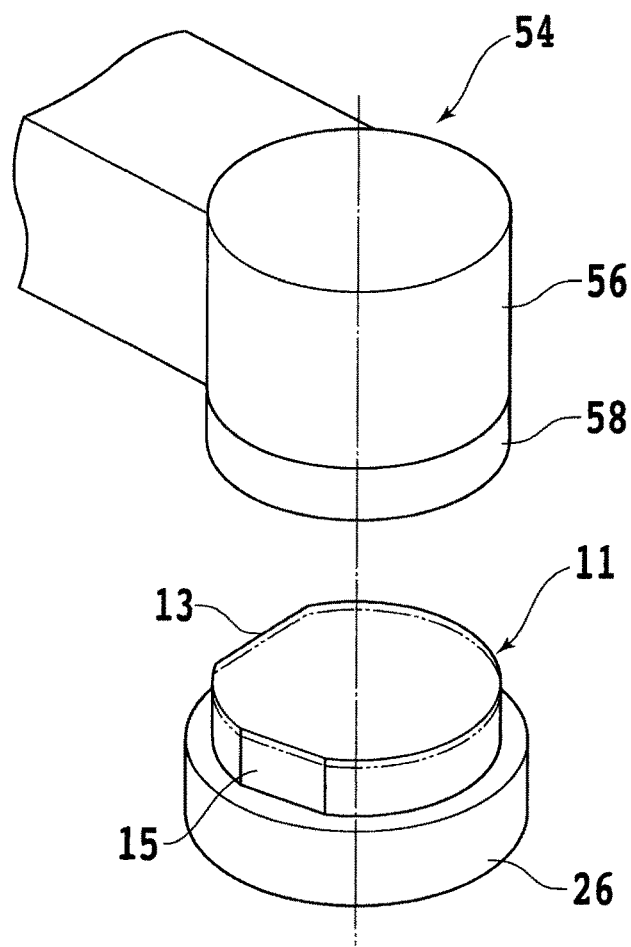
FIGS. 11A and 11B are perspective views for illustrating a wafer separating step.
Figure 11B:
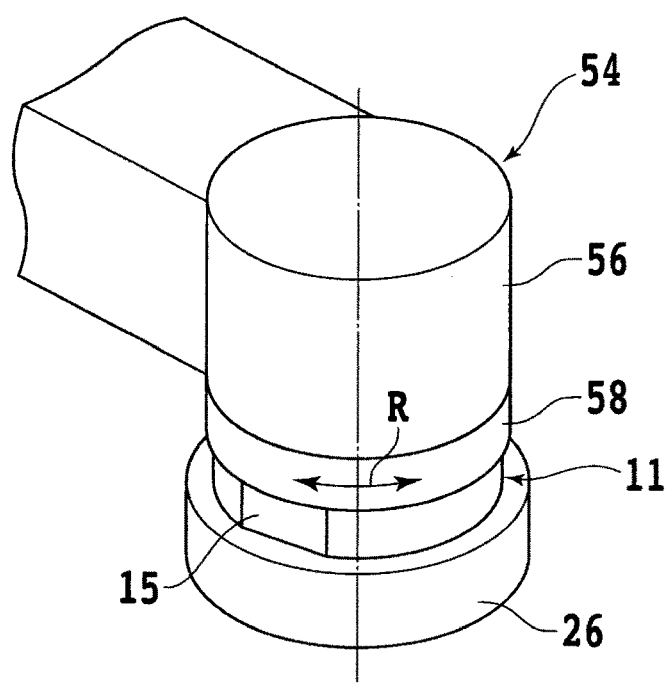

This wafer separating step is performed by using the pressing mechanism 54 shown in FIG. 1. The configuration of the pressing mechanism 54 is shown in FIGS. 11A and 11B. The pressing mechanism 54 includes a head 56 vertically movable by a moving mechanism (not shown) incorporated in the column 52 shown in FIG. 1 and a pressing member 58 rotatable in the direction shown by an arrow R in FIG. 11B with respect to the head 56. As shown in FIG. 11A, the pressing member 54 is relatively positioned above the ingot 11 fixed to the support table 26. Thereafter, as shown in FIG. 11B, the head 56 is lowered until the pressing member 58 comes into pressure contact with the upper surface 11a of the ingot 11.

In the condition where the pressing member 58 is in pressure contact with the upper surface 11a of the ingot 11, the pressing member 58 is rotated in the direction of the arrow R to thereby generate a torsional stress in the ingot 11. As a result, the ingot 11 is broken at the separation start point where the modified layers 23 and the cracks 25 are formed. Accordingly, the hexagonal single crystal wafer 27 shown in FIG. 12 can be separated from the hexagonal single crystal ingot 11. After separating the wafer 27 from the ingot 11, the separation surface of the wafer 27 and the separation surface of the ingot 11 are preferably polished to a mirror finish.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing a hexagonal single crystal wafer from a hexagonal single crystal ingot having a first surface, a second surface opposite to the first surface, a c-axis extending from the first surface to the second surface, and a c-plane perpendicular to the c-axis, where the c-plane is set in the hexagonal single crystal ingot at the molecular level, and where the c-axis is inclined by an off angle with respect to a normal to the first surface, wherein the c-axis and the normal to the first surface intersect each other, and thereby the c-plane is inclined by said off angle with respect to the first surface, the wafer producing method comprising:

a separation start point forming step of setting a focal point of a laser beam having a transmission wavelength to the ingot inside the ingot at a predetermined depth from the first surface, which depth corresponds to a thickness of the wafer to be produced, and next applying the laser beam to the first surface, during a modified layer forming sub-step and an indexing sub-step, while relatively moving the focal point and the ingot to thereby form a modified layer parallel to the first surface and cracks extending from the modified layer along the c-plane, thus forming a separation start point, wherein a pulse width of the laser applied during the separation start point forming step is 4 nanoseconds; and a wafer separating step of separating a plate-shaped member having a thickness corresponding to the thickness of the wafer from the ingot at the separation start point after performing the separation start point forming step, thus producing the wafer from the ingot;

wherein the modified layer forming sub-step includes relatively linearly moving the focal point of the laser beam in a first direction, where the first direction is perpendicular to a second direction, and further wherein said second direction is defined as a direction parallel to a line connecting a point where the c-axis intersects the first surface to a point where the normal intersects the first surface, thereby linearly forming the modified layer extending in the first direction, and wherein the indexing sub-step includes relatively moving the focal point in the second direction to thereby index the focal point by a predetermined amount; and wherein in the modified layer forming step, the laser beam is applied in a condition where a relation of $-0.3 \leq (d-x)/d \leq 0.5$ holds, where d is a diameter of a focused spot of the laser beam and x is a spacing between adjacent focused spots of the laser beam.

2. The wafer producing method according to claim 1, wherein the hexagonal single crystal ingot is selected from a SiC single crystal ingot and a GaN single crystal ingot.

3. The wafer producing method according to claim 1, wherein in the modified layer forming step, the laser beam is applied in a condition where a relation of $0 < (d-x)/d \leq 0.5$ holds, where d is the diameter of a focused spot of the laser beam and x is the spacing between adjacent focused spots of the laser beam.

4. The wafer processing method according to claim 1, wherein said off angle is between 1° and 6°.

5. The wafer processing method according to claim 1, wherein the predetermined amount of the indexing sub-step is calculated based on the length (W1) of the cracks extending from the modified layer along the c-plane that were formed during the separation start point forming step, such that the predetermined amount is set in the range of W1 to 2×W1.

6. The wafer processing method according to claim 5, wherein said length (W1) is between about 100μm and about 350μm.

7. The wafer processing method according to claim 5, wherein said length (W1) is between about 170μm and about 220μm.

8. A wafer producing method for producing a hexagonal single crystal wafer from a hexagonal single crystal ingot having a first surface, a second surface opposite to the first surface, a c-axis extending from the first surface to the second surface, and a c-plane perpendicular to the c-axis, where the c-plane is set in the hexagonal single crystal ingot at the molecular level, and where the c-axis is inclined by an off angle with respect to a normal to the first surface, wherein the c-axis and the normal to the first surface intersect each other, and thereby the c-plane is inclined by said off angle with respect to the first surface, the wafer producing method comprising:
- a separation start point forming step of setting a focal point of a laser beam having a transmission wavelength to the ingot inside the ingot at a predetermined depth from the first surface, which depth corresponds to a thickness of the wafer to be produced, and next applying the laser beam to the first surface, during a modified layer forming sub-step and an indexing sub-step, while relatively moving the focal point and the ingot to thereby form a modified layer parallel to the first surface and cracks extending from the modified layer along the c-plane, thus forming a separation start point; and
- a wafer separating step of separating a plate-shaped member having a thickness corresponding to the thickness of the wafer from the ingot at the separation start point after performing the separation start point forming step, thus producing the wafer from the ingot;
- wherein the modified layer forming sub-step includes relatively linearly moving the focal point of the laser beam in a first direction, where the first direction is perpendicular to a second direction, and further wherein said second direction is defined as a direction parallel to a line connecting a point where the c-axis intersects the first surface to a point where the normal intersects the first surface, thereby linearly forming the modified layer extending in the first direction, and
- wherein the indexing sub-step includes relatively moving the focal point in the second direction to thereby index the focal point by a predetermined amount; and
- wherein in the modified layer forming step, the laser beam is applied in a condition where a relation of $-0.3 \leq (d-x)/d \leq 0.3$ holds, where d is a diameter of a focused spot of the laser beam and x is a spacing between adjacent focused spots of the laser beam.

9. The wafer producing method according to claim 8, wherein in the modified layer forming step, the laser beam is applied in a condition where a relation of $0 < (d-x)/d \leq 0.5$ holds, where d is the diameter of a focused spot of the laser beam and x is the spacing between adjacent focused spots of the laser beam.

10. The wafer processing method according to claim 8, wherein said off angle is between 1° and 6°.

11. The wafer processing method according to claim 8, wherein the predetermined amount of the indexing sub-step is calculated based on the length (W1) of the cracks extending from the modified layer along the c-plane that were formed during the separation start point forming step, such that the predetermined amount is set in the range of W1 to 2×W1.

12. The wafer processing method according to claim 11, wherein said length (W1) is between about 100μm and about 350μm.

13. The wafer processing method according to claim 11, wherein said length (W1) is between about 170 μm and about 220μm.

* * * * *